United States Patent [19]

Tarneja et al.

[11] 4,075,037

[45] Feb. 21, 1978

[54] TAILORING OF RECOVERY CHARGE IN POWER DIODES AND THYRISTORS BY IRRADIATION

[75] Inventors: Krishan S. Tarneja; Joseph E. Johnson; John Bartko, all of Pittsburgh, Pa.

[73] Assignee: Westinghouse Electric Corporation, Pittsburgh, Pa.

[21] Appl. No.: 687,278

[22] Filed: May 17, 1976

[51] Int. Cl.² ............................................. H01L 21/263
[52] U.S. Cl. .................................... 148/1.5; 148/33.5; 148/187
[58] Field of Search ......................... 148/1.5, 33.5, 187

[56] References Cited

U.S. PATENT DOCUMENTS

| 3,809,582 | 5/1974 | Tarneja et al. ........................ 148/1.5 |
| 3,933,527 | 1/1976 | Tarneja et al. ........................ 148/1.5 |

*Primary Examiner*—George T. Ozaki
*Attorney, Agent, or Firm*—C. L. Menzemer

[57] ABSTRACT

The recovery charge of power diodes and thyristors is tailored and matched by irradiation through a major surface of the semiconductor body with a given radiation source, preferably of electron radiation, to a dosage corresponding to between about $1 \times 10^{12}$ and $8 \times 10^{12}$ electrons per centimeter square with 2 MeV electron radiation. Preferably, the recovery charge of each device of a group of a type of diode or thyristor is first measured, and the group divided into subgroups according to the measured recovery charge of each device. The devices of at least one subgroup is then irradiated with said given radiation source to dosages corresponding to between about $1 \times 10^{12}$ and $8 \times 10^{12}$ electrons per centimeter square with 2 MeV electron radiation, and the recovery charge of each irradiated device is again measured to determine the incremental change of recovery charge as a function of irradiation dosage. A recovery charge of another device of said type of diode or thyristor is then measured, and the device irradiated with said radiation source to a determined dosage corresponding to a desired incremental change in recovery charge to tailor the recovery charge of said device to a desired value.

10 Claims, 5 Drawing Figures

TAILORING OF RECOVERY CHARGE IN POWER DIODES AND THYRISTORS BY IRRADIATION

FIELD OF THE INVENTION

The present invention relates to the making of the semiconductor devices and particularly diodes and thyristors.

BACKGROUND OF THE INVENTION

With the advent of silicon junction diodes and thyristors, solid state diodes and thyristors have steadily grown in power handling capacity to very high current and high voltage. In spite of higher power handling capacity, circuit designers are, however, constantly faced with situations where diodes and thyristors must be used in series or in parallel to provide the desired high voltage or high current characteristics for the circuit. One of the most important parameters in series-ing of such devices is the recovery charge ($Q_{rr}$) of the individual devices. The recovery charge of each diode or thyristor in series must be matched with the other diodes and thyristors so that each device supports substantially the same amount of voltage, within specified limits. Otherwise, an individual device of the series having too high a recovery charge will support too much of the series voltage and be burned out, causing failure of the entire series circuit.

Heretofore, the recovery charge was controlled by a gold diffusion step after the diode or thyristor structure was made, typically by diffusion techniques. The gold diffusion changed the lifetime of the anode-base region and in turn, the recovery charge of the device, while leaving the forward voltage drop of the device substantially uneffected. One of the main problems with this procedure has been the controllability and reproducibility, particularly in high current devices (e.g. greater than 500 amps) where a large active area is present.

This application is considered an improvement on the method described and claimed in U.S. Pat. No. 3,933,527 granted Jan. 20, 1976 to the applicants and assignee of this application. Companion patents and patent applications are U.S. Pat. Nos. 3,809,582, 3,840,887, 3,852,612, 3,872,493, 3,877,977, 3,881,963, 3,881,964, and 3,888,701 and U.S. Patent applications Ser. Nos. 540,208 (filed Jan. 10, 1975) now U.S. Pat. No. 3,990,091, Ser. No. 581,255 (filed May 27, 1975), Ser. No. 639,337 (filed Dec. 10, 1975) and Ser. No. 667,791 (filed Mar. 17, 1976), all of which are assigned to the same assignee as the present application.

In U.S. Pat. No. 3,933,527, applicants teach irradiation of power diodes with radiation sources generally and electron radiation preferably to optimize the reverse recovery time while minimizing the forward voltage drop of the diode. The radiation dosage level preferably corresponds to between $1 \times 10^{12}$ and $5 \times 10^{13}$ electrons/cm$^2$ with 2 MeV electron radiation. More preferably, the radiation dosage level corresponds to between $5 \times 10^{12}$ and $2 \times 10^{13}$ electrons/cm$^2$ with 2 MeV electron radiation.

Applicants have now found that the recovery charge of power diodes and thyristors can be predictably tailored, with precision, by utilization of a different and more specific narrower range of radiation dosage corresponding to between about $1 \times 10^{12}$ and $8 \times 10^{12}$ electrons/cm$^2$ and preferably between about $1 \times 10^{12}$ and $5 \times 10^{12}$ electrons/cm$^2$.

SUMMARY OF THE DISCLOSURE

A method is provided for tailoring the recovery charge of devices selected from the group consisting of diodes and thyristors, e.g. for series matching, without significantly affecting other electrical characteristics and particularly the forward voltage drop of the devices. The reverse switching time is also left substantially uneffected in most devices. Power diodes and thyristors can be fabricated with the present method achieving the highest possibile minority carrier lifetimes attainable by diffusion techniques, and still the recovery charge can be readily and accurately tailored to desirable, low values at the final stages of the manufacturing process.

The method comprises the steps of positioning a junction diode or thyristors semiconductor body with a major surface thereof to be exposed to a radiation source, and thereafter irradiating said semiconductor body with a major surface thereof to be exposed to a radiation source, and thereafter irradiating said semiconductor body with the radiation source to a dosage corresponding to between about $1 \times 10^{12}$ and $8 \times 10^{12}$ electrons/cm$^2$ and preferably between about $1 \times 10^{12}$ and $5 \times 10^{12}$ electrons/cm$^2$ with 2 MeV electron radiation.

Electron irradiation is preferably used as the radiation source because of availability and inexpensiveness. It is anticipated, however that any kind of radiation may be appropriate provided it is capable of disrupting the atomic lattice to create energy levels substantially decreasing minority carrier lifetime without correspondingly increasing the carrier regeneration rate.

Preferably, the method comprises first measuring the recovery charge of each device of a group of a type of diode or thyristor and dividing said devices into groups according to the measured recovery charge of each device. Devices of at least one subgroup and preferably at least two subgroups are then irradiated with a given radiation source to dosages corresponding to between about $1 \times 10^{12}$ and $8 \times 10^{12}$ electrons/cm$^2$ and preferably to between about $1 \times 10^{12}$ and $5 \times 10^{12}$ electrons/cm$^2$ with 2 MeV electron radiation. The recovery charge of each irradiated device of each subgroup is then again measured to determine the incremental change of recovery charge as a function of irradiation dosage. The preferred method continues by measuring the recovery charge of another device of said type of diode or thyristor. That device is then irradiated with said radiation source to a determined dosage corresponding to a desired incremental change in recovery charge to tailor the recovery charge of said device to a desired value.

Other details, objects and advantages of the invention will become apparent as the following description of the presently preferred embodiments and presently preferred methods of practicing the same proceed.

BRIEF DESCRIPTION OF THE DRAWINGS

In the accompanying drawings, the preferred embodiments of the invention and presently preferred methods of practicing the invention are illustrated, in which.

DESCRIPTION OF THE PREFERRED EMBODIMENTS

Figure 1:
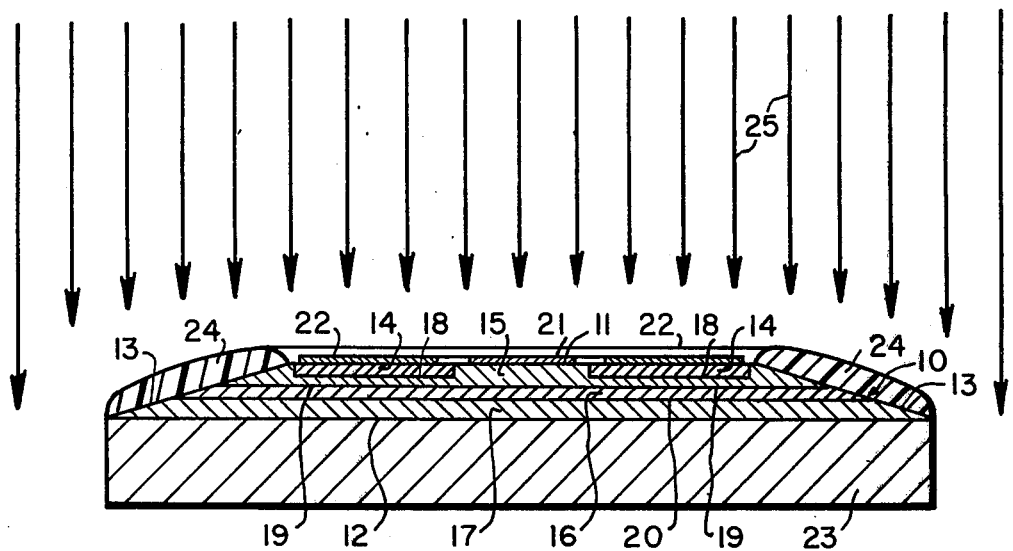
FIG. 1 is an elevational view in cross-section of a high power thyristor being irradiated in accordance with the invention.

Referring to FIG. 1, a center-filled silicon thyristor is disposed in semiconductor wafer or body 10 having opposed major surfaces 11 and 12 and curvilinear side surfaces 13. Semiconductor body 10 is typically N-type float-zone silicon having a resistivity between 10 and 250 ohm-cm and a thickness between 10 and 30 mils. The thyristor is comprised of cathode-emitter region 14 and anode-emitter region 17 of impurities of opposite conductivity type adjoining major surfaces 11 and 12, respectively. The thyristor also has cathode-base region 15 and anode-base region 16 of impurities of opposite conductivity type in the interior of body 10 between emitter regions 14 and 17. Cathode-emitter region 14 and cathode-base region 14, as well as anode-base region 16 and anode-emitter region 17 are also of opposite conductivity type. By this arrangement, the thyristor is provided with a four-layer impurity structure in which three PN junctions 18, 19 and 20 are formed at the transition between regions of opposite type conductivity.

Cathode-base and anode-emitter regions 15 and 17 are preferably simultaneously formed by selective diffusion of, for example, boron, gallium or aluminum through major surfaces 11 and 12 by standard diffusion techniques. However, cathode-base region 15 may be made thicker than anode-emitter region 17 by delayed diffusion of the anode-emitter region or subsequent etching of major surface 12. The resulting diffusion of cathode-base region 15 is typically with a surface impurity concentration between $1 \times 10^{17}$ and $5 \times 10^{19}$ atoms/cm$^3$ and a thickness between 50 and 100 microns. Anode-emitter region 17 is also preferably formed with a surface impurity concentration between $1 \times 10^{17}$ and $5 \times 10^{19}$ atoms/cm$^3$ and a thickness between 50 and 100 microns. Cathode-emitter region 14 is thereafter formed preferably by selective diffusion of, for example, phosphorus through major surface 11, typically to a surface impurity concentration of between $1 \times 10^{19}$ and $5 \times 10^{20}$ atoms/cm$^3$ and a thickness of between 5 and 25 microns.

The thyristor is provided with center-fired gate by adjoining cathode-base region 15 to major surface 11 at center portions thereof. Cathode-emitter region 14 thus extends around surface portions of region 15. To provide electrical connections to the thyristor, metal contacts 21 and 22 make ohmic contact at major surface 11 to cathode-base region 15 and cathode-emitter region 14, respectively, and supporting metal electrode 23 makes ohmic contact at major surface 12 to anode-emitter region 17. Metal contacts 21 and 22 are preferably formed by selective metallization of a suitable metal such as aluminum, molybdenum, gold, silver, tantalum and base alloys thereof to a thickness typically of 40,000 Angstroms, or alternatively, by indiscriminate metallization of such a suitable metal followed by selective removal of portions of the desposited metal by standard photolithographic and etch techniques. Electrode 23 is preferably formed by alloying a metal substrate of typically 80 mils in thickness such as molybdenum to major surface 12. To reduce channeling and atmospheric effects on the thyristor operation, side surface 13 are beveled, etched and coated with a suitable passivating resin 24 such as silicone, epoxy or varnish composition.

Irradiation is performed on the thyristor in accordance with the present invention by positioning major surface 11 of body 10 for exposure to a suitable radiation source such as a Van de Graaff accelerator, as shown in FIG. 1. The thyristor is thereafter irradiated to a dosage corresponding to between about $1 \times 10^{12}$ and $8 \times 10^{12}$ electrons/cm$^2$ with 2 MeV electron radiation and preferably to between $1 \times 10^{12}$ and $5 \times 10^{12}$ electrons/cm$^2$ with 2 MeV electron radiation.

The radiation source used for these irradiations is preferably electron radiation because of the availability and inexpensiveness. Moreover, electron radiation (or gamma radiation) may be preferred in applications where the damage desired to the semiconductor lattice is to single atoms and small groups of atoms. This in in contrast to neutron, proton and alpha radiation which causes more localized, but larger scale disorders of as many as a few hundred atoms in the semiconductor crystal. The latter type of radiation source may, however, be preferred in certain applications because of its better designed range and better controlled depth of lattice damage. It is anticipated that any kind of irradiation may be appropriate provided it is capable of disrupting the atomic lattice to create energy levels substantially decreasing minority carrier lifetime and not correspondingly increasing the carrier regeneration rate.

Electron radiation is also preferred over gamma radiation because of its availability to provide adequate dosages in a commercially practical time. For example, a $1 \times 10^{12}$ electrons/cm$^2$ dosage at 2 MeV electron radiation will result in approximately the same lattice damage as that produced by $1 \times 10^6$ rads dosage of gamma radiation. Such dosages of gamma radiation, however, would entail an hour or more and usually several weeks of irradiation, while such dosages can be supplied by electron radiation in minutes.

Further, it is preferred that the energy of the electron irradiation be greater than 1 MeV and most desirably of 2 MeV or greater. Lower level radiation is generally believed to result in substantial elastic collisions with the atomic lattice, and, therefore, does not provide enough damage to the lattice in commercially feasible times.

The optimum dosage within the prescribed range is selected empirically. This precise dosage will vary the type of the thyristor, the kind of radiation, the energy of the radiation, and the incremental change in recovery charge that is desired.

To illustrate the operation of the invention, the recovery charges of 50 1200 volts, 100 amps T92N thyristors and 50 3000 volts 600 amp T92N thyristors were tailored in accordance with the invention. The recovery charge ($Q_{44}$) of each thyristor was measured using techniques described in Electronic Design 5, pp. 50–53 (Mar. 1, 1976). It should be noted in this connection that "recovery charge" is alternatively sometimes called "reverse recovery charge" or "recovered charge".

The range of measured recovery charge of the 1200 volt T92N thyristors were found to range from about 10 microcoulombs to over 300 microcoulombs. The specified range for recovery charge for seriesing this type of thyristor is between about 100 and 200 microcoulombs. Accordingly, all thyristors of the 50 thyristor group measuring greater than 200 microcoulombs was irradiated to a dosage of $4 \times 10^{12}$ electrons/cm$^2$ with 2 MeV electron radiation from a Van de Graaff accelerator, and the recovery charge again measured following the same procedure used in the initial measurement. 95% of the irradiated 1200 volt thyristors were found to have a recovery charge between 100 and 200 microcoulombs. The thyristors with a measured recovery charge of less than 200 microcoulombs were not irradiated because the $Q_{rr}$ values were within specification.

Similarly, the range of measured recovery charge of the 3000 volt T92N thyristors were found to range from about 400 to over 900 microcoulombs. The specified range for recovery charge for seriesing for this type of thyristor is between about 400 and 500 microcoulombs. Accordingly, all thyristors of the 50 thyristor group measuring greater than 500 microcoulombs were divided into subgroups of 200 microcoulombs per subgroup. That is, a first subgroup contained all thyristors with measured recovery charge between 500 and 700 microcoulombs. A second subgroup contained all thyristors with measured recovery charge between 700 and 900 microcoulombs, and a third subgroup contained all thyristors with measured recovery charge greater than 900 microcoulombs. The first subgroup was irradiated to a dosage of $1 \times 10^{12}$ electrons/cm$^2$ with the 2 MeV Van de Graaff accelerator; the second subgroup was irradiated to a dosage of $2 \times 10^{12}$ electrons/cm$^2$ with the 2 MeV Van de Graaff accelerator; and the third subgroup was irradiated to a dosage of $3 \times 10^{12}$ electrons/cm$^2$ with the 2 MeV Van de Graaff accelerator. The recovery charge of each irradiated thyristor was then measured using the same procedure used in the initial measurement of recovery charge. Again 95% of the entire irradiated group was found to have a recovery charge between about 400 and 500 microcoulombs. The thyristors with a measured recovery charge of less than 500 microcoulombs were not irradiated because the $Q_{rr}$ values were within specification.

Figure 2:
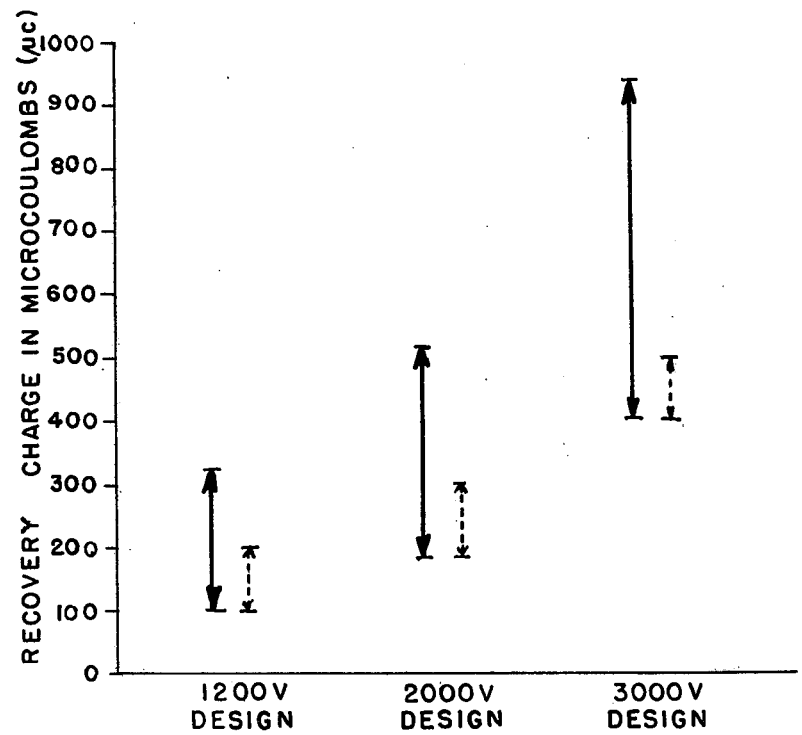
FIG. 2 is a graph showing the range of recovery charge ($Q_{rr}$) of different types of thyristors before and after irradiation in accordance with the present invention.

The reduction of the recovery charge of the individual thyristors and the spread of recovery charge of the group of thyristors is dramatically illustrated in FIG. 2. The irradiation reduces the recovery charge of each thyristor and the spread of recovery charge of each type of thyristor to a specified value with 95% reliability. These results are achieved with little change in forward voltage drop of the thyristor, only 0.2 millivolts per $1 \times 10^{12}$ electrons/cm$^2$ dosage increment. For example, 1200 volt T92N thyristor showed a reduction in recovery charge from greater than 200 microcoulombs to the 100 to 200 microcoulombs range, while the forward voltage changed from 1.3 to 1.3-1.4 volts at 1500 amps. There was also only a slight change in turn-off time of the irradiated thyristors. FIG. 2 also shows the anticipated reduction in recovery charge of a 2000 volt, 800 amp T92N thyristor when irradiated as above described in connection with the 3000 volt, 600 amp T92N thyristor.

Figure 3:
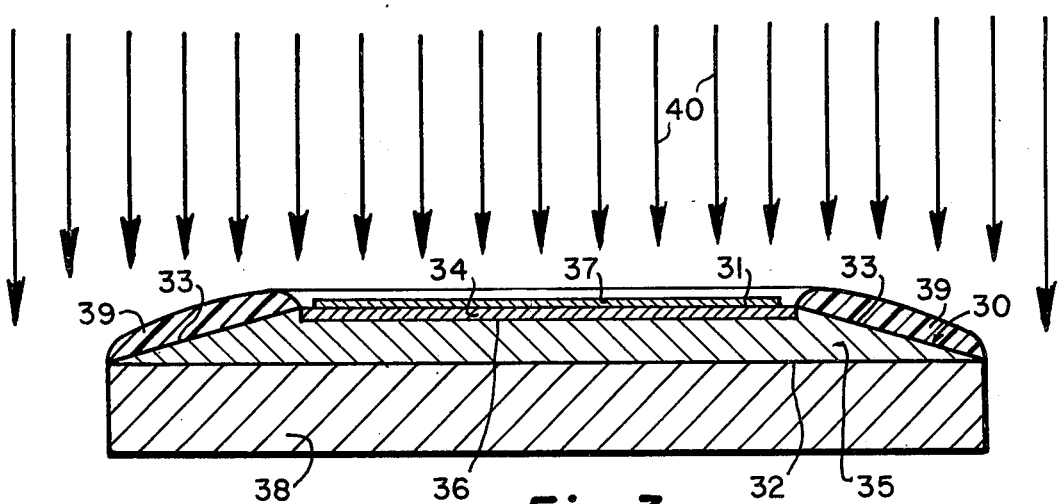
FIG. 3 is an elevational view in cross-section of a high power junction silicon diode being irradiated in accordance with the present invention.
Figure 4:
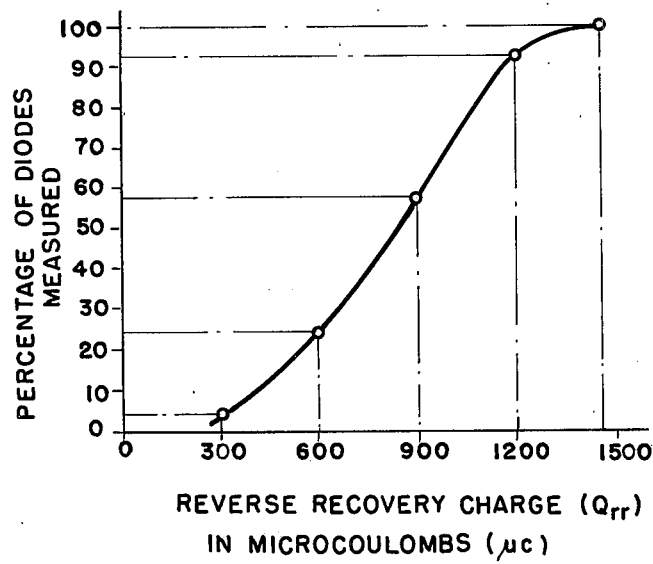
FIG. 4 is a graph showing a typical distribution of recovery charge ($Q_{rr}$) of a group of a given type of silicon junction power diodes taken from a production run.
Figure 5:
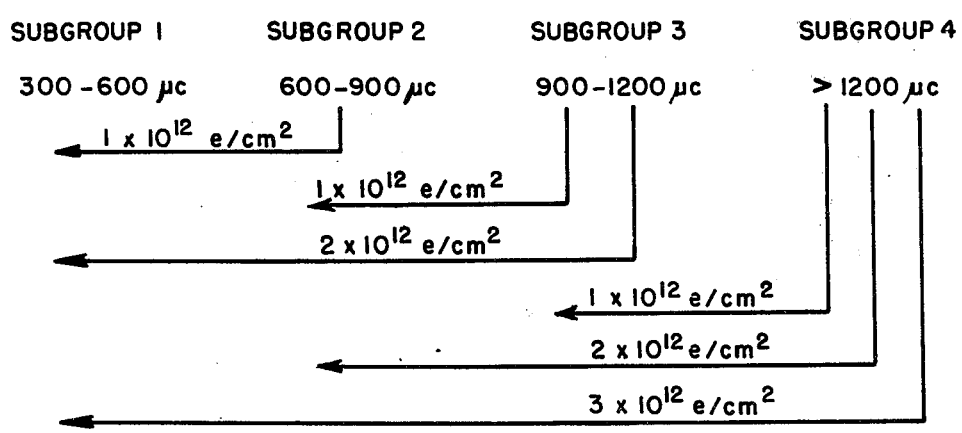
FIG. 5 is a schematic showing the subgrouping of a silicon junction power diodes of a given type of diode before and after irradiation determining the incremental change of recovery charge as a function of irradiation dosage.

Referring to FIGS. 3 through 5, the method is described and illustrated in its operation on power diodes. The method is commenced by taking a group of power diodes having a structure as shown in FIG. 3, from a production run after passivation, and measuring the recovered charge.

Referring to FIG. 3, the structure of the power diodes is shown and described. Each diode is deposed in a semiconductor wafer or body 30 having opposed major surfaces 31 and 32 and curvilinear side surfaces 33. Semiconductor body 30 is typically N-type float-zone silicon having a resistivity between 1 and 250 ohm-cm and a thickness between 8 and 30 mils. The diode has cathode region 34 and anode region 35 of impurities of opposite conductivity type adjoining major surfaces 31 and 32 respectively. Formed at the transition between regions 34 and 35 in the interior body 30 is PN junction 36. Cathode region 34 and PN junction 36 are typically formed by selective diffusion of a typical impurity such as boron, gallium or aluminum through major surface 11.

To provide electrical connection to the diode, metal contacts 37 and 38 make ohmic contact to cathode region 34 and anode region 35 at major surfaces 31 and 32, respectively. Metal contact 37 is preferably formed by metallization of a suitable metal, such as aluminum, molybdenum, gold, silver, tantalum and base alloys thereof, onto major surface 11 typically to a thickness of about 40,000 Angstrons, and metal contact 38 is preferably formed by alloying a metal substrate, such as molybdenum to major surface 12. To reduce channeling effects and atmospheric effects on the diode operation, side surfaces 33 are beveled, etched and coated with a suitable passivating resin 39 such as a silicone, epoxy or varnish composition.

The group of power diodes as taken from the production run first have their recovery charge ($Q_{rr}$) individually measured preferably by the procedure described in Electronic Design 5, pp. 50–53 (Mar. 1, 1976). A typical distribution of recovery charge is shown in FIG. 4, where the recovery charge varies widely. FIG. 4 shows the recovery charge distribution for a group of 300 R70N, 3 kilovolt, 500 amp silicon junction diodes used for purposes of illustration of the invention. The recovery charge of these diodes is shown to vary from below 300 microcoulombs to over 1200 microcoulombs. This is for too great a spread of recovery charge for series matching of the diode.

All diodes with a measured charge of greater than 900 microcoulombs, roughly 60 to 70 of the 300 diode group, were irradiated with a dosage of $1 \times 10^{12}$ electrons/cm$^2$ with the 2 MeV Van de Graaff accelerator. The irradiation of each diode is performed as shown in FIG. 3. Irradiation is performed on the diode by positioning major surface 31 of body 30 for exposure to a suitable radiation source. The diode is thereafter irradiated by radiation 40 from the radiation source to a dosage selected as described. The radiation is again preferably electron radiation from a Van de Graaff accelerator preferably of greater than 1 MeV and typically 2 MeV in energy.

Then, the recovery charges of the irradiated diodes were measured by the procedure used to initially measure the recovery charges. The irradiated devices with initially measured recovery charges between 900 and 1200 microcoulombs were found after irradiation to have measured recovery charges between 600 and 900 microcoulombs with 95% reliability, and the irradiated devices with an initially measured recovery charge of greater than 1200 microcoulombs were found after irradiation to have measured recovery charges between 900 and 1200 microcoulombs with 95% reliability. Subsequently, the irradiated devices with initial recovery charges of greater than 1200 microcoulombs were irradiated a second time to a dosage of $1 \times 10^{12}$ electrons/cm$^2$ (an accumulative dosage of $2 \times 10^{12}$ electrons/cm$^2$) with the 2 MeV Van de Graaff accelerator, and the recovery charges again measured by the procedure used to initially measure the recovery charge. The devices were found to have their recovery charges reduced to between 600 and 900 microcoulombs with 95% reliability.

Accordingly, it was concluded that the incremental change of recovery charge as a function of irradiation dosage was 300 microcoulombs reduction for each $1 \times 10^{12}$ electron/cm$^2$ dosage from the given radiation source. The change is then plotted on a schematic as shown in FIG. 5 to determine the incremental change of recovered charge as a function of irradiation dosage for the particular type of diode whose recovered charge is to be tailored with a specified reliability factor, e.g. 95%. This function was subsequently checked by irradiating the devices with measured recovery charges between 300 and 600 microcoulombs with a dosage of $1 \times 10^{12}$ electrons/cm$^2$ from the same radiation source. The recovery charge of diodes was subsequently measured with the same procedure used to measure the recovery charge initially and found to have recovery charges between 300 and 600 microcoulombs again with a 95% reliability factor.

As shown by FIG. 5, subsequent devices of the R70N power diodes can have their recovery charges tailored to any desired value within the tolerance provided by the 300 microcoulomb subgroups. The spread of recovery charge for each subgroup will vary with the precision with which the recovery charge of the diodes are to be matched and the recovery charge spread of each subgroup will be based on the tolerances of the specifications for the finished diodes.

By this method, the highest possible lifetimes could be obtained to the anode or anode-base region supporting the blocking voltage in the diode or thyristor during the diffusion processing, and the recovery charge can be readily tailored to a low, matching value at the final stage. Recovery charge values can thus be accurately, uniformly and reproducibly obtained even with the large area devices required to achieve high current capacities of 500 amps and greater. Typically, 95% of the irradiated devices are in a specified range by irradiation in accordance with the present invention. Yet, the forward voltage drop, switching time (i.e. reverse recovery time or turn-off time) and other electrical characteristics are substantially unchanged by the irradiation.

While presently preferred embodiments have been shown and described, it is distinctly understood that the invention may be otherwise variously performed within the scope of the following claims. For example, the invention has been particularly described with respect to silicon semiconductor devices. It is contemplated that the present invention has utility with other semiconductor materials such as germanium and gallium arsenide, although the particular radiation and energy thereof and the effectiveness of the invention will doubtless vary with the semiconductor material.

What is claimed is:

1. A method of tailoring the recovery charge of a device of a type of diode or thyristor comprising the steps of:
   A. positioning a junction diode or thyristor semiconductor body with a major surface thereof to be exposed to a radiation source;
   B. thereafter irradiating said semiconductor body with the radiation source to a dosage between about $1 \times 10^{12}$ and $8 \times 10^{12}$ electrons/cm$^2$ to reduce the recovery charge of the device.

2. A method of tailoring the recovery charge of a device of a type of diode or thyristor as set forth in claim 1 wherein:
   the irradiation of step B is to a dosage corresponding to between $1 \times 10^{12}$ and $5 \times 10^{12}$ electrons/cm$^2$.

3. A method of tailoring the recovery charge of a device of a type of diode or thyristor as set forth in claim 1 wherein:
   the radiation source of step B is electron radiation.

4. A method of tailoring the recovery charge of a device of a type of diode or thyristor as set forth in claim 3 wherein:
   the electron radiation has an energy greater than 1 MeV.

5. A method of tailoring the recovery charge of a device of a type of diode or thyristor as set forth in claim 4 wherein:
   the irradiation of step B is to a dosage corresponding to between $1 \times 10^{12}$ and $5 \times 10^{12}$ electrons/cm$^2$.

6. A method of tailoring the recovery charge of a device of a type of diode or thyristor comprising the steps of:
   A. measuring the recovery charge of each device of a group of a type of diode or thyristor and dividing said devices into subgroups according to the measured recovery charge of each device;
   B. irradiating devices of at least one subgroup with a given radiation source to dosages corresponding to between about $1 \times 10^{12}$ and $8 \times 10^{12}$ electrons/cm$^2$ with 2 MeV electron radiation;
   C. measuring the recovery charge of each irradiated device of each subgroup to determine the incremental change of recovery charge as a function of irradiation dosage;
   D. measuring the recovery charge of another device of said type of diode or thyristor; and
   E. thereafter irradiating said device with said radiation source to a determined dosage corresponding to a desired incremental change in recovery charge to tailor the recovery charge of said device to a desired value.

7. A method of tailoring the recovery charge in a device of a type of diode or thyristor as set forth in claim 6 wherein:
   the irradiation of step B is to a dosage corresponding to between $1 \times 10^{12}$ and $5 \times 10^{12}$ electrons/cm$^2$.

8. A method of tailoring the recovery charge of a device of a type of diode or thyristor as set forth in claim 6 wherein:
   the radiation source is electron radiation.

9. A method of tailoring the recovered charge of a device of a type of diode or thyristor as set forth in claim 6 wherein:
   the energy of the electron radiation source is greater than 1 MeV.

10. A method of tailoring the recovery charge of a device of a type of diode or thyristor as set forth in claim 9 wherein:
    the irradiation of step B is to a dosage corresponding to between $1 \times 10^{12}$ and $5 \times 10^{12}$ electrons/cm$^2$.